(12) United States Patent
Cheng

(10) Patent No.: US 6,469,900 B2
(45) Date of Patent: Oct. 22, 2002

(54) APPARATUS FOR LOCKING AND EJECTING A MODULE DEVICE

(75) Inventor: Chen Yu Cheng, Taipei (TW)

(73) Assignee: Quanta Computer, Inc., Taoyuan (TW)

( * ) Notice: Subject to any disclaimer, the term of this patent is extended or adjusted under 35 U.S.C. 154(b) by 0 days.

(21) Appl. No.: 09/764,553

(22) Filed: Jan. 17, 2001

(65) Prior Publication Data

US 2002/0093792 A1 Jul. 18, 2002

(51) Int. Cl.[7] .................................................. G06F 1/16
(52) U.S. Cl. ........................ 361/726; 361/740; 361/759; 292/148; 248/551
(58) Field of Search ................................. 361/726, 727, 361/683–686, 740, 759; 292/148, 151, 307 R; 70/57–58, 85; 248/551–553

(56) References Cited

U.S. PATENT DOCUMENTS 5,691,882 A * 11/1997 Ma ............................ 361/684
5,692,208 A * 11/1997 Felcman et al. ............. 361/683
5,701,230 A * 12/1997 Liang et al. ................ 361/681

* cited by examiner

*Primary Examiner*—Darren Schuberg
*Assistant Examiner*—Hung Van Duong
(74) *Attorney, Agent, or Firm*—Perkins Coie LLP

(57) ABSTRACT

The locking and ejecting apparatus includes a latching mechanism, an ejection mechanism, a first string and a second string. The latching mechanism is for locking the module device in a locked position or unlocking the module device from the locked position. The ejection mechanism is for ejecting the module device on disengagement of the latching mechanism from the locked position. During the unlocking and ejecting operations, the second button is pulled right after the first button is pressed. After the module device is released from the locked position and ejected out of the internal bay, the first spring positioned to generate a first force restores the latching mechanism and the second spring positioned to generate a second force restores the ejection mechanism.

9 Claims, 4 Drawing Sheets

US 6,469,900 B2

APPARATUS FOR LOCKING AND EJECTING A MODULE DEVICE

BACKGROUND OF THE INVENTION

1. Field of the Invention

The invention relates in general to a locking and ejecting apparatus, and more particularly to a locking and ejecting apparatus for a portable computer with bay structures.

2. Description of the Related Art

Portable computers are commonly called notebook or subnotebook computers, which are small enough to carry. As portable computers have increased in sophistication and decreased in size, efforts have been made to increase the amount of stored data and the number of peripheral devices. In order to provide greater flexibility in the operation of a portable computer system, it is often desirable to incorporate several module devices into the system by supplying an internal bay within the portable computer. The internal bay can flexibly hold one or more removable module devices such as a CD ROM drive, a floppy disk drive, a DVD ROM drive. Further, many applications permit the module device to be removed or interchanged for reasons of data security, backup purposes or for expanding a system.

However, one problem arising with the existing removable design in portable computer is the retaining mechanism of a module device. The traditional one-sided latch of the retaining mechanism for a removable module device is often unreliable to lock the module device in the internal bay. Besides, it is hard to remove the module device from the portable computer by griping it out after releasing the retaining mechanism. Consequently, what is needed for the removable design of the module device is reliable installation and easy removal for usage by the portable computer system.

SUMMARY OF THE INVENTION

It is therefore an object of the invention to provide an apparatus for locking and ejecting a module device having reliable latching and easy removal of the module device.

The invention achieves the above-identified objects by providing an apparatus for locking and ejecting a module device inserted in an internal bay of a portable computer. The locking and ejecting apparatus includes a latching mechanism, an ejection mechanism, a first string and a second string. The latching mechanism is for locking the module device in a locked position or unlocking the module device from the locked position. And the ejection mechanism is for ejecting the module device on disengagement of the latching mechanism from the locked position. When the module device is inserted into the internal bay in a locked position, the rotatable latch engages one side of the module device and the movable latch engages the other side of the module device.

During the unlocking and ejecting operations, the second button is pulled right after the first button is pressed. The rotatable latch rotates around the pivot and the movable latch moves along to disengage the module device. The push arm is then driven to draw the push rod. Thus, the push rod carries the module device outward and the module device is ejected.

After the module device is released from the locked position and ejected out of the internal bay. The first spring positioned to generate a first force restores the latching mechanism by moving the movable latch, rotating the rotatable latch and returning the first button back to original positions. The second spring positioned to generate a second force restores the ejection mechanism by moving the push rod back to the original position.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
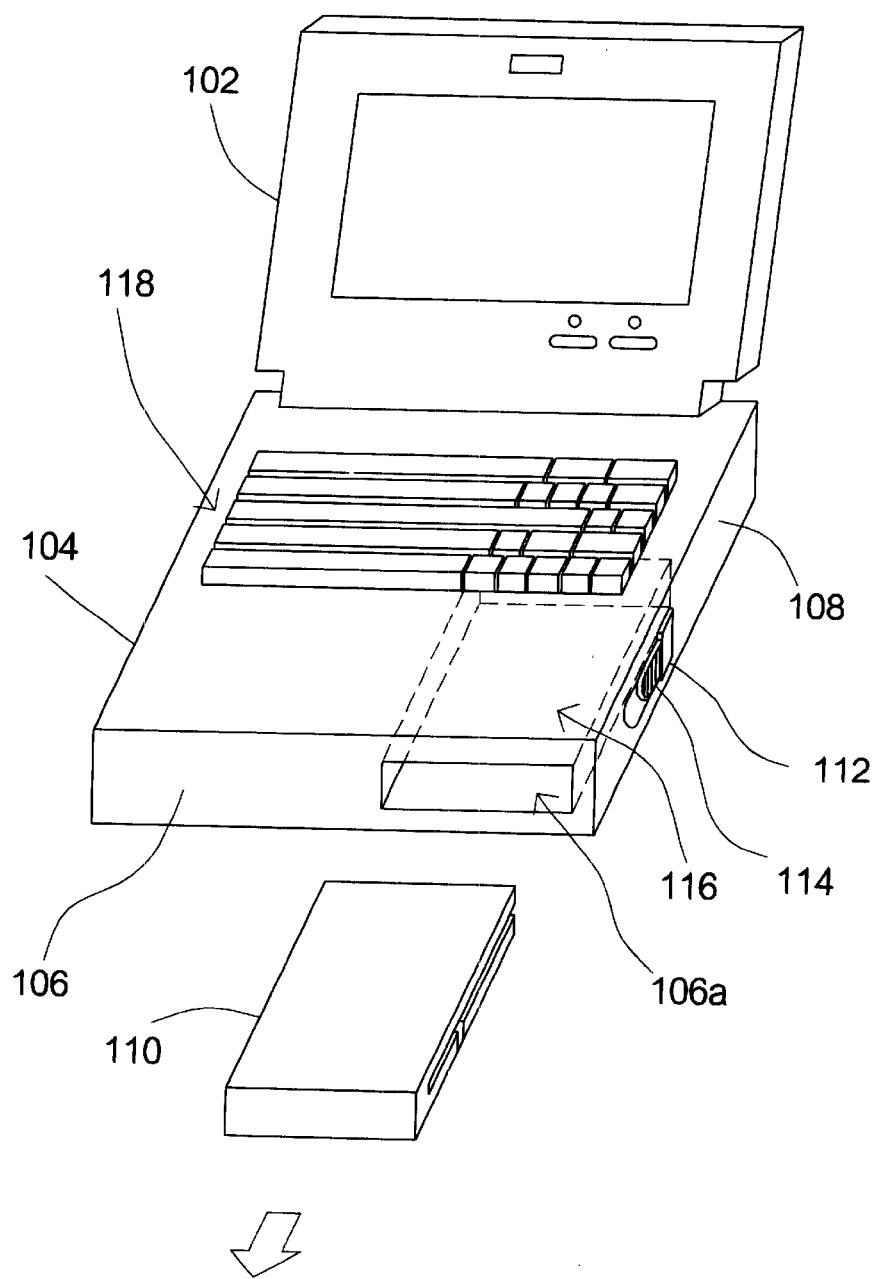
FIG. 1 shows a perspective view of a portable computer incorporating an apparatus for locking and ejecting a module device according to a preferred embodiment of the invention.

Referring to FIG. 1, a perspective view of a portable computer incorporating an apparatus for locking and ejecting a module device according to a preferred embodiment of the invention is shown. The portable computer 100 includes a display portion 102 and a base portion 104. The display portion 102 is typically a flat panel display such as a liquid crystal display (LCD) or other relatively small display. The base portion 104 has a keyboard assembly 118 mounted on the top panel. The internal bay 116 is an extended area of the opening 106a on the front panel 106 and located within the base portion 104. A removable module device 110, such as a CD ROM drive, a floppy disk drive, a DVD ROM drive, can be operatively inserted inwardly into the internal bay 116. The first button 112 and the second button 114 are located on the side panel 108 of the base portion 104 of the portable computer 100.

In other embodiments, the internal bay 116 may be located in other locations of the portable computer 100 provided that the opening and the buttons are located on the adjacent panels. For example, the opening 106a may be on the side panel 108 and then the first button 112 and the second button 114 may be located on the front panel 106 of the base portion 104.

Figure 2:
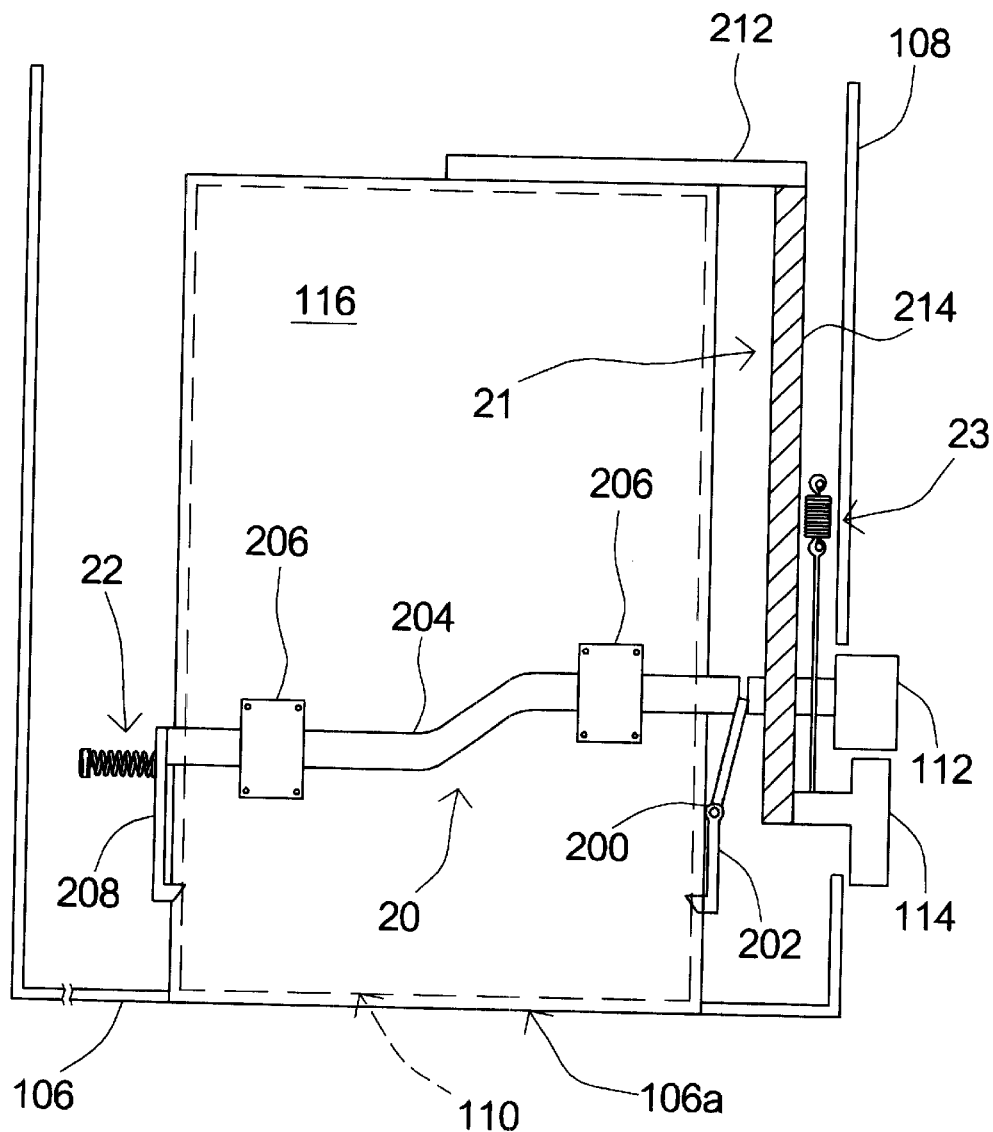
FIG. 2 shows a top view of the interior structure of the apparatus for locking and ejecting a module device in the base portion of the portable computer in FIG. 1.

Referring to FIG. 2, a top view of the interior structure of the apparatus for locking and ejecting a module device in the base portion of the portable computer in FIG. 1 is shown. The apparatus for locking and ejecting a module device includes a latching mechanism 20, an ejection mechanism 21, a first spring 22 and a second spring 23. The latching mechanism 20, ejection mechanism 21, first spring 22, and second spring 23 are coupled to the internal bay 116 respectively.

As shown in FIG. 2, the latching mechanism 20 further includes a rotatable latch 202 and a movable latch 208. The rotatable latch 202 is mounted on a pivot 200 and the pivot 200 is coupled to the internal bay 116. The movable latch 208 is attached to and carried by a transmission shaft 204 and the transmission shaft 204 is disposed on the internal bay 116 by mounting at least one secured member 206. The pivot 200 and the secured member 206 are physically affixed to the internal bay 116 so that the pivot 200 and the secured member 206 remain fixed relative to the internal bay 116 during the locking or ejecting operations. The first button 112 located on the side panel 108 is coupled to the latching mechanism 20. Besides, the ejection mechanism 21 further includes a push rod 212. The push rod 212 is attached to a push arm 214 and the push arm 214 is disposed on the internal bay 116. The second button 114 located on the side panel 108 is coupled to the ejection mechanism 21.

When the module device 110 is inserted into the internal bay 116, the latching mechanism 20 locks the module device 110 in a locked position. The rotatable latch 202 engages one side of the module device 110. The movable latch 208 engages the other side of the module device 110.

Figure 3A:
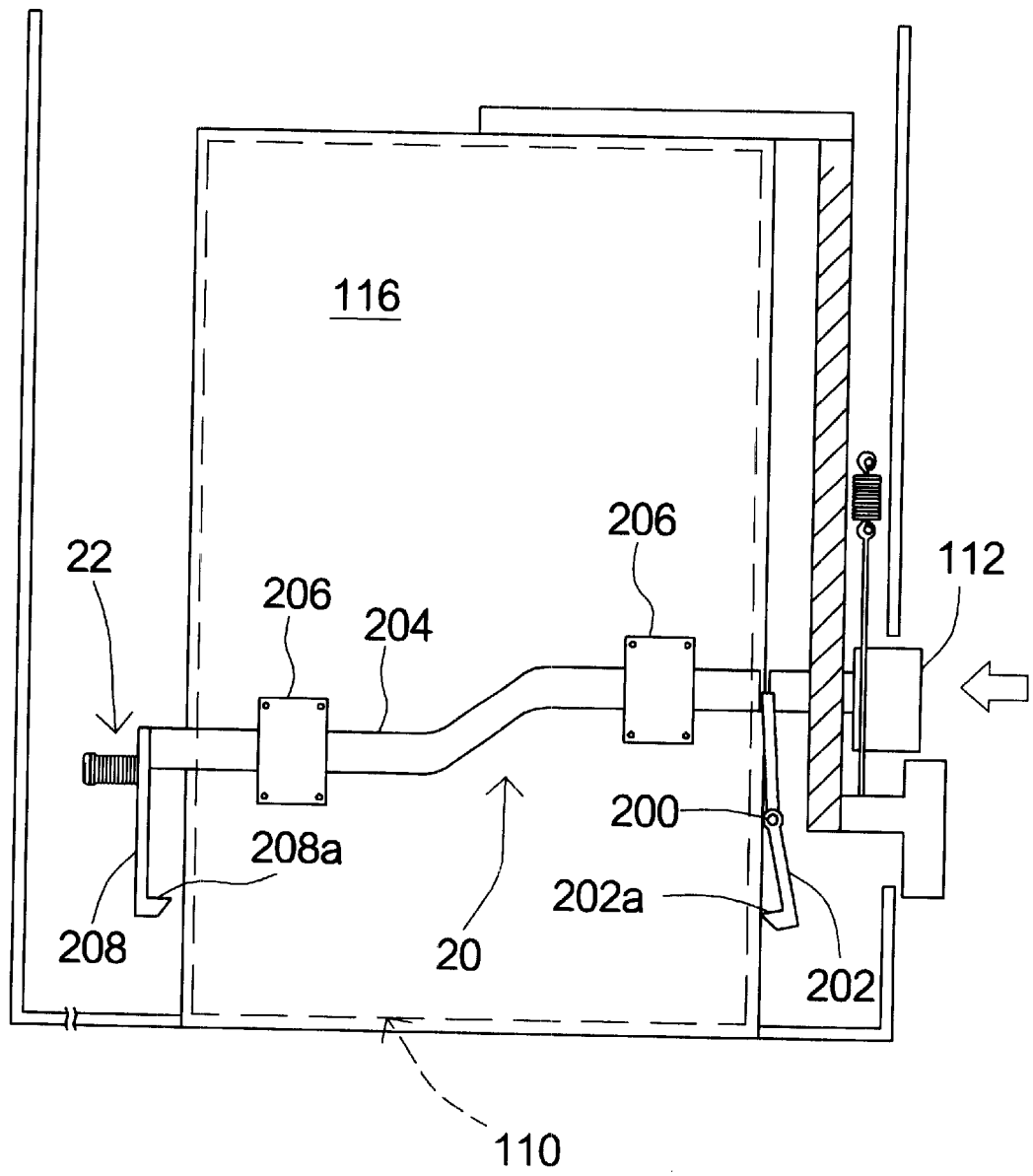
FIG. 3A illustrates a top view of an apparatus for locking and ejecting a module device while the first button is pressed to actuate a latching mechanism.

Referring to FIG. 3A, a top view of an apparatus for locking and ejecting a module device while the first button is pressed to actuate a latching mechanism is illustrated. As shown in FIG. 3A, the actuation of the first button 112 causes the latching mechanism 20 to unlock the module device 110 (as shown in FIG. 1) from the locked position. When the first button 112 is pressed, the rotatable latch 202 rotates around the pivot 200. The hook 202a at the end of the rotatable latch 202 turns away so that one side of the module device 110 is disengaged. In the meantime, the transmission shaft 204 is driven to move the movable latch 208 under the constriction of secured member 206. The hook 208a of the movable latch 208 moves along so that the other side of the module device 110 is disengaged and the first spring 22 is compressed.

Figure 3B:
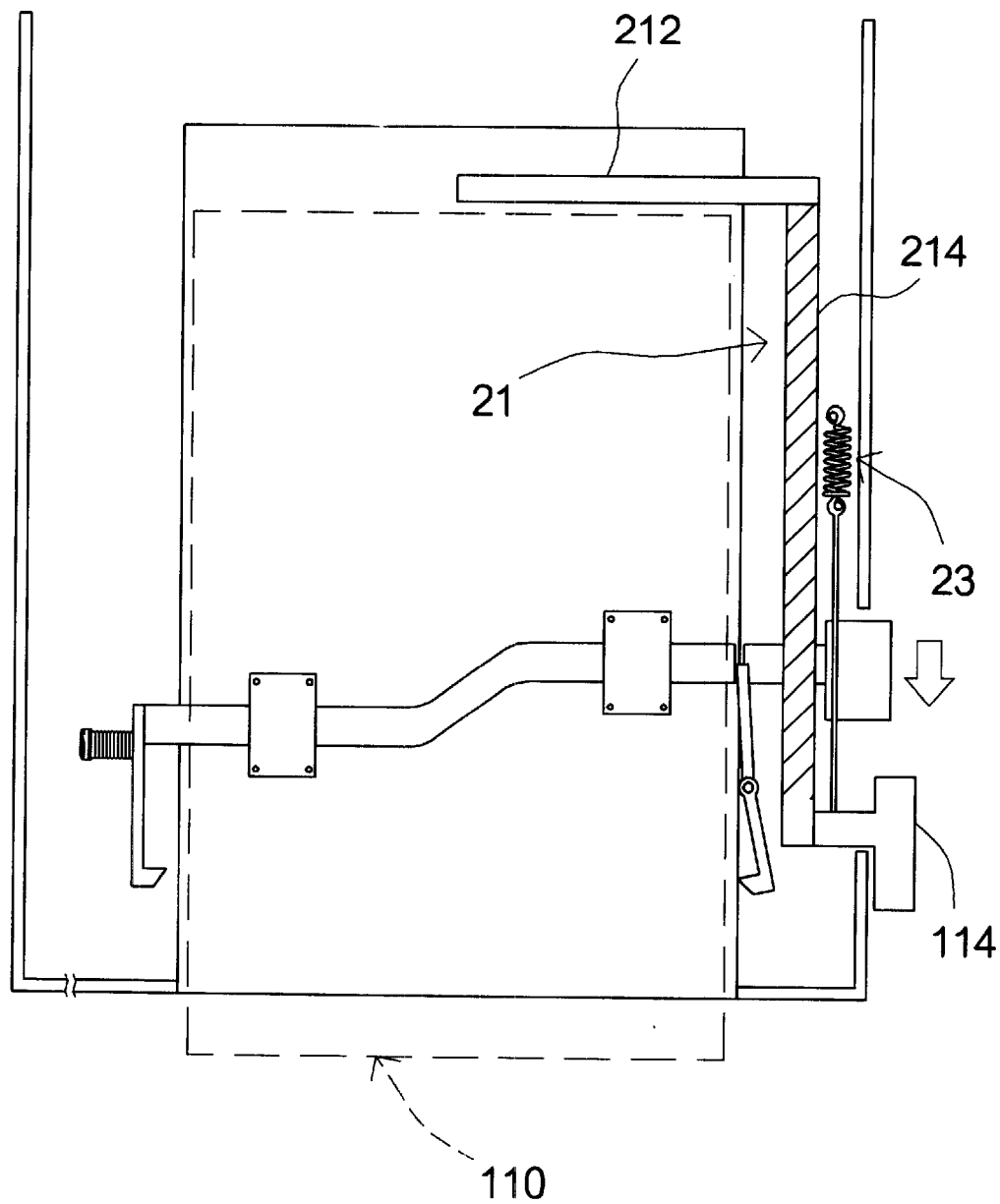
FIG. 3B illustrates a top view of an apparatus for locking and ejecting a module device while the second button is pulled to actuate an ejection mechanism.

Referring to FIG. 3B, a top view of an apparatus for locking and ejecting a module device while the second button is pulled to actuate an ejection mechanism is illustrated. As shown in FIG. 3B, the actuation of the second button 114 causes the ejection mechanism 21 to eject the module device 110 out of the internal bay 116 on disengagement of the latching mechanism 20 from the locked position. The second button 114 is pulled right after the first button 112 is pressed in a direction from the side panel 108 to the front panel 106. Therefore, the push arm 214 is driven to draw the push rod 212 by the second button 114 and the second spring 23 is stretched. The push rod 212 carries the module device 110 outward and the module device 110 is then ejected.

After the unlocking and ejecting operations, the module device 110 is released from the locked position and ejected out of the internal bay 116. The first spring 22 positioned to generate a first force restores the latching mechanism 20. The movable latch 208 and the transmission shaft 204 are moved to the original positions by the first force. The rotatable latch 202 turns round to the original direction and the first button 112 returns to the original position. Moreover, the second spring 23 positioned to generate a second force to restore the ejection mechanism 21. The push rod 212 along with the push arm 214 and the second button 114 are moved back to the original position by the second force.

The apparatus for locking and ejecting a module device according to the preferred embodiment of the invention provides an improved retaining mechanism for a portable computer system with bay structures. The latching mechanism with two latches engages the module device in the internal bay reliably in the lock position. Besides, the ejection mechanism attains to the easy removal of the module device by pushing the first button and pulling the second button. Instead of griping the module device with difficulty, the module device can be easily ejected out of the internal bay by the usage of the ejection mechanism. In addition, providing a force by first spring against both the movable latch and rotatable latch and a force by second spring against the push rod, the module device can be consolidated within the internal bay firmly. Moreover, it increases the life of the locking and ejection apparatus when the module device is not in the internal bay. Therefore, the invention greatly enhances the steadiness of the insertion of the module device and simplifies the movement of removing out the module device inserted within the internal bay.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for locking and ejecting a module device, wherein the module device is operatively inserted in an internal bay of a portable computer, the apparatus comprising:

a latching mechanism for locking the module device in a locked position or unlocking the module device from the locked position, the latching mechanism is coupled to the internal bay; and an ejecting mechanism for ejecting the module device on disengaging of the latching mechanism from the locked position, the ejecting mechanism is coupled to the internal bay, wherein the latching mechanism further comprises a rotatable latch mounted on a pivot, the pivot coupled to the internal bay, the rotatable latch capable of engaging or disengaging a first side of the module device.

2. The apparatus for locking and ejecting a module device according to claim 1, wherein the transmission shaft is disposed on the internal bay by mounting at least one secured member.

3. The apparatus for locking and ejecting a module device according to claim 2, wherein the ejection mechanism further comprises:

a push rod for pushing the module device outward, the push rod attached to and carried by a push arm.

4. The apparatus for locking and ejecting a module device according to claim 2, wherein the latching mechanism further comprises a movable latch attached to and carried by a transmission shaft, the movable latch capable of engaging or disengaging a second side of the module device.

5. The apparatus for locking and ejecting a module device according to claim 3, wherein the apparatus further comprises:

a first button, located on a side panel of the portable computer and coupled to the latching mechanism.

6. The apparatus for locking and ejecting a module device according to claim 5, wherein the apparatus further comprises:

a second button, located on the side panel of the portable computer and coupled to the ejection mechanism.

7. The apparatus for locking and ejecting a module device according to claim 5, wherein the apparatus further comprises:

a first spring coupled to the internal bay, the first spring positioned to generate a first force to restore the latching mechanism by moving the movable latch, rotating the rotatable latch and returning the first button back to original positions after the module device is released from the locked position.

8. The apparatus for locking and ejecting a module device according to claim 6, wherein the actuation of the first button causing the latching mechanism to unlock the module device, the actuation of the second button then causing the ejection mechanism to eject the module device out of the internal bay.

9. The apparatus for locking and ejecting a module device according to claim 6, wherein the apparatus further comprises:
 a second spring coupled to the internal bay, the second spring positioned to generate a second force to restore the ejection mechanism by moving the push rod back to the original position after the module device is ejected out of the internal bay.

* * * * *